United States Patent
Shim et al.

(10) Patent No.: US 7,667,510 B2
(45) Date of Patent: Feb. 23, 2010

(54) DELAY LOCKED LOOP CIRCUIT AND METHOD THEREOF

(75) Inventors: Seok-Bo Shim, Kyoungki-do (KR); Mi-Hye Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/164,190

(22) Filed: Jun. 30, 2008

(65) Prior Publication Data
US 2009/0273380 A1 Nov. 5, 2009

(30) Foreign Application Priority Data
Apr. 30, 2008 (KR) ................. 10-2008-0040935

(51) Int. Cl.
*H03L 7/06* (2006.01)
(52) U.S. Cl. .................................. 327/158; 327/149
(58) Field of Classification Search ............ None
See application file for complete search history.

(56) References Cited

U.S. PATENT DOCUMENTS

| | | | | |
|---|---|---|---|---|
| 6,191,632 B1* | 2/2001 | Iwata et al. | ................ | 327/295 |
| 6,278,303 B1* | 8/2001 | Nakanishi et al. | ............ | 327/156 |
| 6,463,008 B2* | 10/2002 | Okuda et al. | ............ | 365/233.12 |
| 6,498,524 B1* | 12/2002 | Kawasaki et al. | ............ | 327/158 |
| 6,985,401 B2* | 1/2006 | Jang et al. | .................... | 365/194 |
| 7,034,590 B2* | 4/2006 | Shin | ............................ | 327/158 |
| 7,489,172 B2* | 2/2009 | Kim | ............................ | 327/160 |
| 2001/0052808 A1* | 12/2001 | Hamamoto et al. | ........ | 327/291 |
| 2003/0076143 A1* | 4/2003 | Nishimura et al. | .......... | 327/158 |

FOREIGN PATENT DOCUMENTS

| KR | 1020040093819 A | 11/2004 |
|---|---|---|
| KR | 1020050089474 A | 9/2005 |
| KR | 1020050097700 A | 10/2005 |
| KR | 1020070110627 A | 11/2007 |

OTHER PUBLICATIONS

Notice of Allowance issued from Korean Intellectual Property Office on Aug. 26, 2009 with an English Translation.

* cited by examiner

*Primary Examiner*—Cassandra Cox
(74) *Attorney, Agent, or Firm*—IP & T Law Firm PLC

(57) ABSTRACT

A delayed locked loop (DLL) circuit for reducing power consumption in updating a delay value of an external clock after locking. The DLL circuit includes a phase comparator for comparing a phase of a feedback clock and a phase of an external clock, and a delay unit for delaying an external clock in response to a comparison signal from the phase comparison. A replica unit receives the delayed external clock and outputs the feedback clock. A toggling controller disables toggling of the delayed external clock that is inputted to the replica unit for a predetermined time at a regular interval after locking.

15 Claims, 5 Drawing Sheets

DELAY LOCKED LOOP CIRCUIT AND METHOD THEREOF

CROSS-REFERENCE TO RELATED APPLICATION

The present invention claims priority of Korean patent application number 10-2008-0040935, filed on Apr. 30, 2008, which is incorporated by reference in its entirety.

BACKGROUND OF THE INVENTION

The present invention relates to a delay locked loop (DLL) circuit, and more particularly, to a DLL circuit for reducing power consumption in updating a delay value of an external clock after locking.

A synchronous semiconductor device such as a Double Data Rate Synchronous DRAM (DDR SDRAM) receives an external clock from an external device such as a memory controller and uses it as an internal clock of a semiconductor device. The synchronous semiconductor device transmits data to external devices using an inputted internal clock. Therefore, temporal synchronization between the external clock and data is very important in order to stably transmit data between a memory and a memory controller.

The external clock is inputted to the semiconductor device and distributed throughout the entire semiconductor device as an internal clock. The internal clock may be significantly delayed when the internal clock is transferred to a part that is comparatively far away from an input pin compared to an internal clock transferred to a part adjacent to the input pin. Therefore, a phase difference is generated between the internal clock and the external clock.

In order to overcome such a problem, the synchronous semiconductor device includes a clock synchronization circuit such as a delay locked loop (DLL) circuit. The DLL circuit generates an internal clock by compensating a clock delay component which is generated while transferring the internal clock to the data output end of the semiconductor device, thereby synchronizing the internal clock used for inputting and outputting final data of the semiconductor device with the external clock.

FIG. 1 is a block diagram illustrating a delay locked loop (DLL) circuit according to the related art.

As shown, the DLL circuit according to the related art includes a phase comparator 103, a replica unit 105, a delay controller 107, and a delay line unit 109.

The phase comparator 103 compares a phase of an external clock EXT_CLK with a phase of a feedback clock FB_CLK outputted from the replica unit 105. Here, the feedback clock FB_CLK is a clock modeled based on a clock delay component in the semiconductor device. The phase comparator 103 compares the phases by determining a logical level of the feedback clock FB_CLK at a rising edge of the external clock EXT_CLK and outputs a comparison signal CMP to the delay controller 107.

The delay controller 107 receives the comparison signal CMP and outputs a delay control signal DELAY for controlling a delay value Dd of the delay line unit 109 by deciding increment or decrement of the delay value Dd. The delay line unit 109 receives the delay control signal DELAY, delays the external clock EXT_CLK, and outputs the delayed external clock DL_CLK.

The delayed external clock DL_CLK is fed back to the replica unit 105. The delayed external clock DL_CLK is inputted to the phase comparator 103 through the replica unit 105 as a feedback clock FB_CLK. Then, the phase comparator 103 compares phases again and the above described processes are repeated until the phase of the external clock EXT_CLK is matched with the phase of the feedback clock FB_CLK.

If the phases of the external clock and the feedback clock FB_CLK are matched, the delay value Dd of the external clock EXT_CLK is locked in the DLL circuit (locking).

As shown, the DLL circuit according to the related art may further include a mode generator 113. The mode generator 113 receives the comparison signal CMP of the phase comparator 103 and decides an increment amount of the delay value Dd of the external clock EXT_CLK which can be a large increment or small increment. For example, if the phase difference between the external clock EXT_CLK and the feedback clock FB_CLK is great, the mode generator 113 generates a mode signal MODE to greatly increase the delay value Dd so as to quickly lock the DLL circuit. That is, the mode signal MODE is a signal for deciding one of a first mode for greatly increasing the delay value and a second mode for not greatly increasing the delay value.

The mode generator 113 also determines whether the DLL circuit is locked or not. For example, the mode generator 113 determines that the DLL circuit is locked if the phase comparator 103 alternatively outputs a high level comparison signal CMP and a low level comparison signal CMP. That is, if a ban bang error is generated, the mode generator 113 determines that the DLL circuit is locked. Since it is difficult to precisely match phases when the delay value Dd is digitally controlled, the phase comparator 103 may generate the bang bang error. If the delay value of the external clock EXT_CLK is locked in the DLL circuit, the mode generator 113 enables a locking signal LOCK and outputs the enabled locking signal LOCK.

The locking processes are stably controlled by the pulse generator 115 at the DLL circuit. FIG. 2 is a diagram illustrating a pulse signal of the pulse generator 115.

Referring to FIG. 2, the pulse generator 115 generates a plurality of pulse signals that are synchronized with the external clock EXT_CLK and have a regular period. The pulse signal of the pulse generator 115 sequentially enables each part of the DLL circuit.

That is, the pulse signal of the pulse generator 115 sequentially enables the phase comparator 103, the mode generator 113, and the delay controller 107 according to the locking processes. The pulse signal of the pulse generator 115 may be referred to as an enable signal of each element of the DLL circuit. The phase comparator 103 operates in response to a phase comparison enable signal PD_EN. The mode generator 113 operates in response to a mode enable signal MODE_EN and the delay controller 107 also operates in response to a delay control signal DELAY EN.

Operation results of each element are sustained until the next operation is performed, and the operations results may be used for the next operation. For example, a latch may be included at an output unit of the phase comparator 103 in order to sustain a phase comparison result between the enabling periods of the phase comparison enable signal PD_EN and the mode enable signal MODE_EN until an enable point of the mode enable signal MODE_EN where the mode generator 113 operates. According to design, various methods may be applied.

Referring to FIG. 1 again, if the delay value Dd is locked (locking) in the DLL circuit, an update process is performed. In the update process, a phase of the external clock EXT_CLK is compared with a phase of a feedback clock FB_CLK and the delay value Dd of the external clock EXT_CLK is corrected at a regular interval after locking. As described above, it is not necessary to frequently compare the phases of the external clock EXT_CLK and the feedback clock FB_CLK and to frequently control the delay value Dd of the external clock because the phases of the external clock EXT_CLK and the feedback clock FB_CLK are not greatly mismatched after locking. Therefore, enable signals having long intervals PD_EN, MODE_EN, and DELAY_EN are used in the update process compared with the enable signals in the locking process of the DLL circuit.

In the update process after locking, the delay value Dd of the external clock is corrected with a comparatively long interval compared to that for the locking process. That is, although the correction of the delay value Dd in the update process is performed less frequently than that in the locking process, the feedback clock FB_CLK is always toggled in the update process according to the related art. Therefore, the power consumption of the DLL circuit disadvantageously increases.

SUMMARY OF THE INVENTION

Embodiments of the present invention are directed to providing a delay locked loop (DLL) circuit for reducing power consumption by eliminating toggling of a clock inputted to a replica unit in an update process that corrects a delay value after locking the DLL circuit.

In accordance with an aspect of the invention, there is provided A delay locked loop (DLL) circuit, including: a phase comparator for comparing a phase of a feedback clock and a phase of an external clock; a delay unit for delaying an external clock in response to a comparison signal from the phase comparison; a replica unit for receiving the delayed external clock and outputting the feedback clock; and a toggling controller for disabling toggling of the delayed external clock that is inputted to the replica unit for a predetermined time at a regular interval after locking.

DESCRIPTION OF SPECIFIC EMBODIMENTS

Hereinafter, a DLL circuit in accordance with the present invention will be described in detail with reference to the accompanying drawings.

Figure 3:
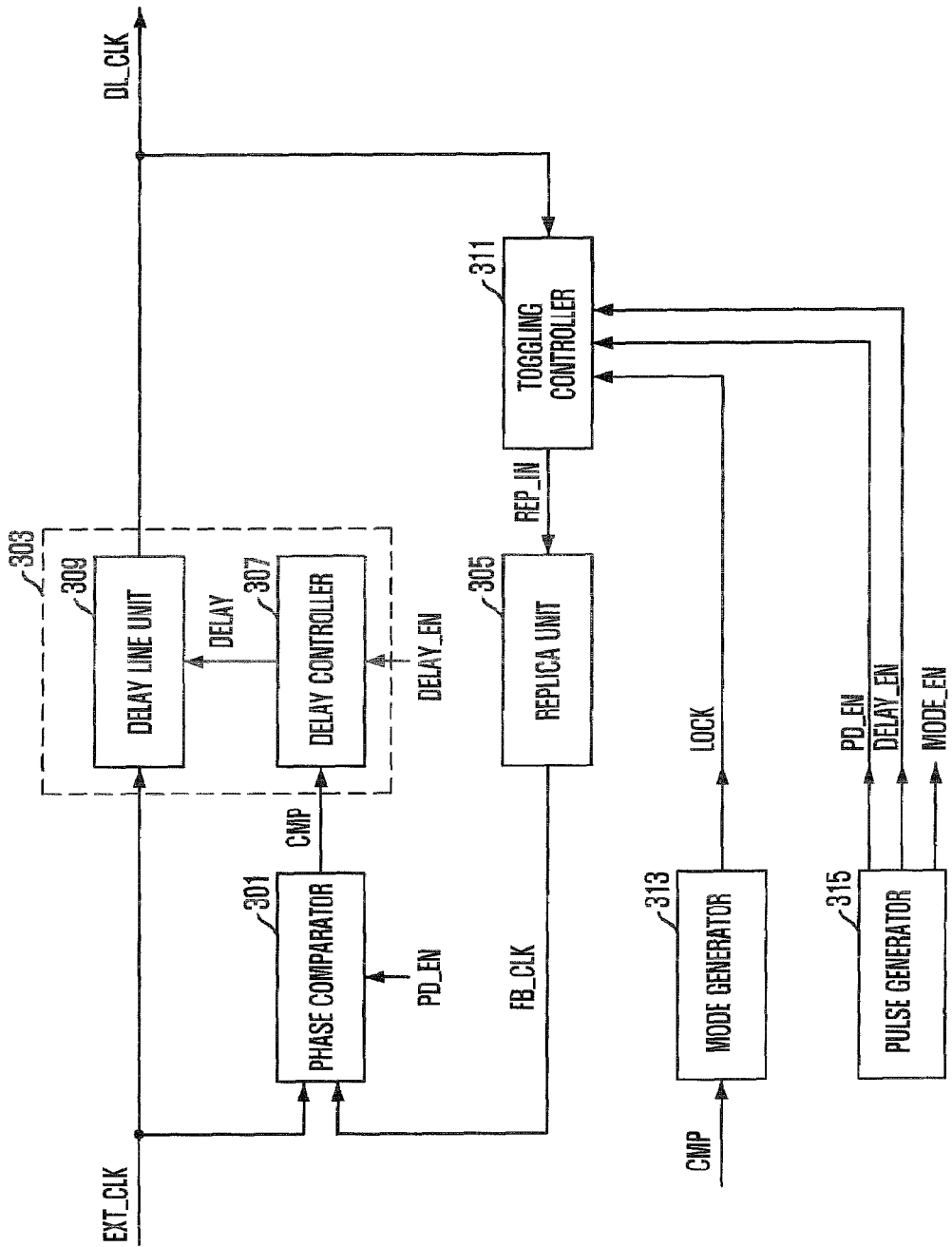
FIG. 3 is a block diagram of a delay locked loop (DLL) circuit in accordance with an embodiment of the present invention.

FIG. 3 is a block diagram of a delay locked loop (DLL) circuit in accordance with an embodiment of the invention.

Referring to FIG. 3, a DLL circuit according to the present embodiment includes a phase comparator 301 for comparing phases of a feedback clock FB_CLK and an external clock EXT_CLK, a delay unit 303 for delaying the external clock EXT_CLK in response to a comparison signal CMP of the phase comparator 301, a replica unit 305 for receiving the delayed external clock EXT_CLK and outputs the feedback clock FB_CLK, and a toggling controller 311 for disabling toggling of the delayed external clock DL_CLK inputted from the replica unit 305 at a regular interval for a predetermined time after locking. Here, the external clock EXT_CLK can be replaced with a reference clock REF_CLK, and the reference clock REF_CLK is a clock generated by buffering a certain external clock through a clock buffer (not shown).

The delay unit 303 includes a delay controller 307 for outputting a delay control signal DELAY to control a delay value Dd of the external clock EXT_CLK in response to the comparison signal CMP of the phase comparator 301 and a delay line unit 309 for delaying the external clock EXT_CLK in response to the delay control signal DELAY and outputs the delayed external clock EXT_CLK.

Unlike the related art, the DLL circuit according to the present embodiment additionally includes the toggling controller 311 for disabling toggling of the delayed external clock DL_CLK inputted to the replica unit 305. The toggling controller 311 disables toggling of the delayed external clock DL_CLK that is delayed for the predetermined time in the update process.

Since the replica unit 305 receives the external clock DL_CLK that is delayed but not toggled unlike the related art, the power consumption of the replica unit 305 is reduced. Therefore, overall power consumption of the DLL circuit is reduced.

Figure 1:
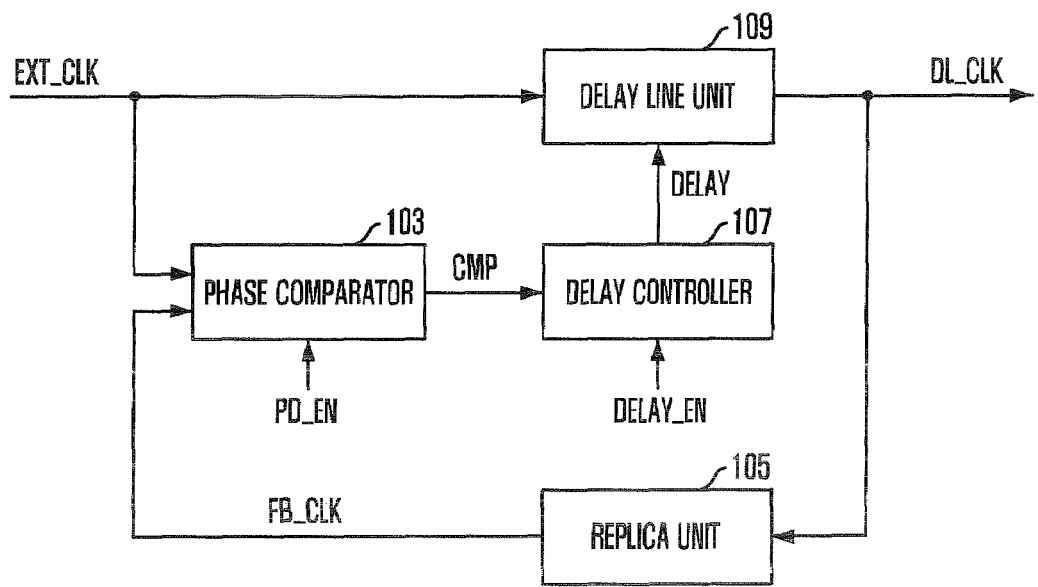
FIG. 1 is a block diagram illustrating a delay locked loop (DLL) circuit according to the related art.
Figure 1:
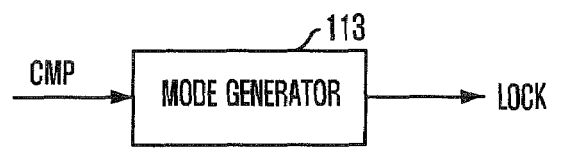
Figure 1:
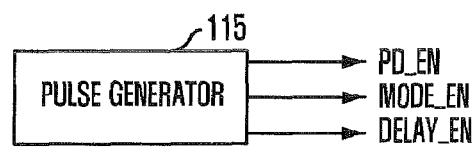
Figure 2:
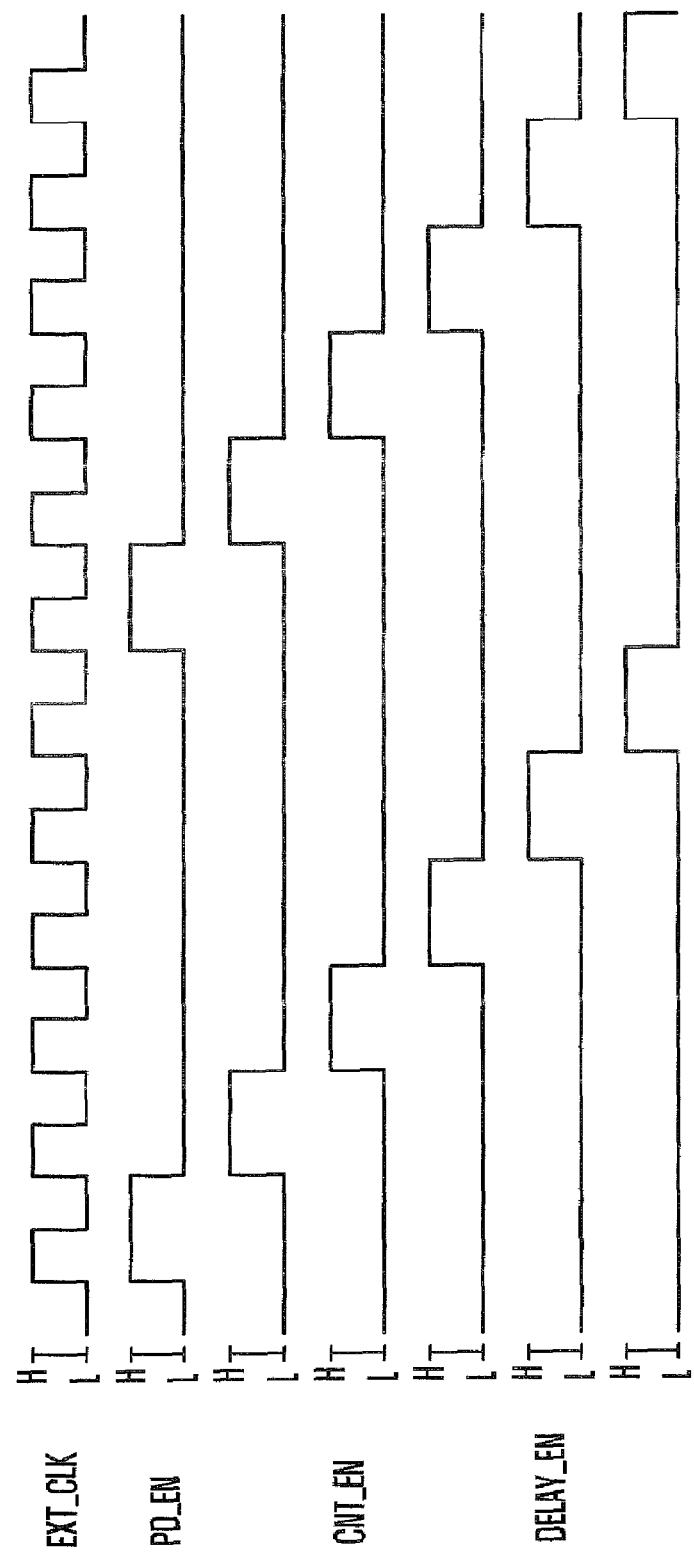
FIG. 2 is a diagram illustrating a pulse signal of the pulse generator 115.

The phase comparator 301 and the delay controller 307 of the DLL circuit according to the present embodiment operate in response to a phase comparison enable signal PD_EN and a delay control enable signal DELAY_EN of the pulse generator 315 as shown in FIG. 1. The pulse generator 315 generates pulse type enable signals PD_EN and DELAY_EN having a regular interval, which is synchronized with the external clock EXT_CLK, and controls each element of the DLL circuit according to the present embodiment. The phase comparator 301 and the delay controller 307 sequentially operate by sequentially generating the phase comparison enable signal PD_EN and the delay control enable signal DELAY_EN.

Since the enable signals PD_EN and DELAY_EN are generated at a very short interval, the phase comparator 301 and the delay controller 307 compares phases of the external clock EXT_CLK and the feedback clock FB_CLK at a very short interval and also controls the delay value Dd of the external clock EXT_CLK at a very short interval in the locking process of the DLL circuit according to the present embodiment.

Therefore, the phase comparator 301 cannot properly compare phases of the external clock EXT_CLK and the feedback clock FB_CLK because if toggling of the delayed external clock DL_CLK feedback from the replica unit 305 is disabled before locking, toggling of the feedback clock FB_CLK is also disabled.

However, the pulse generator 315 generates enable signals PD_EN, CNT_EN, and DELAY_EN at a comparatively long interval in an update process compared to that in the locking process. After locking, it is not necessary to frequently compares the phases of the external clock EXT_CLK and the feedback clock FB_CLK and to frequently control a delay value Dd of the external clock EXT_CLK in the update process compared to the locking process of the DLL circuit because the phases of the external clock EXT_CLK and the feedback clock FB_CLK are not greatly mismatched.

In the update process, the phase comparator 301 compares the phases of the external clock EXT_CLK and the feedback clock FB_CLK with a comparatively long interval compared to that in the locking process of the DLL circuit and controls the delay value Dd of the external clock EXT_CLK at the comparatively long interval too. Therefore, it is possible to compare next phases although the toggling controller 311 disables toggling of the feedback clock FB_CLK for the predetermined time because there is enough temporal margin until a next phase comparing point after comparing the current phases.

The predetermined time is a time period from an enable point of the phase comparison enable signal PD_EN to an enable point of a delay control enable signal DELAY_EN.

The toggling controller 311 disables toggling of the delayed external clock DL_CLK using the phase comparison enable signal PD_EN and the delay control enable signal DELAY_EN from the enable point of the phase control enable signal PD_EN to an enable point of the delay control enable signal DELAY_EN.

The toggling controller 311 generates a toggling termination signal TOG that is enabled from an input point of the phase comparison enable signal PD_EN to an input point of the delay enable signal DELAY_EN. The toggling controller 311 disables toggling of the delayed external clock DL_CLK to a predetermined logical level using the enabled toggling termination signal TOG. After the predetermined time, the toggling termination signal TOG is disabled, and the toggling controller 311 outputs the delayed external clock DL_CLK that toggles again.

Therefore, the phase comparator 301 can compare phases by receiving a toggled feedback clock FB_CLK at a phase comparison point for comparing a next external clock EXT_CLK and a next feedback clock FB_CLK after comparing the external clock EXT_CLK and the feedback clock FB_CLK in the update process.

Meanwhile, the DLL circuit according to the present embodiment may additionally include a mode generator 313. The mode generator 313 receives a comparison signal CMP of the phase comparator 301, outputs a locking signal LOCK, and determines a degree of a delay value Dd according to a phase difference of the external clock EXT_CLK and the feedback clock FB_CLK as shown in FIG. 1. The mode generator 313 is also enabled by the mode enable signal MODE_EN of the pulse generator 315. The phase comparator 301, the mode generator 313, and the delay controller 307 are sequentially enabled.

Finally, the toggle controller 311 disables toggling of the external clock EXT_CLK by enabling a toggling termination signal TOG from an operating point of the phase comparator to an operation point of the delay controller 307 in the update process. That is, the power consumption of the replica unit 305 is reduced because the replica unit 305 receives a delayed external clock DL_CLK that is delayed but not toggled unlike the related art. Therefore, the overall power consumption of the entire DLL circuit is also reduced.

Figure 4:
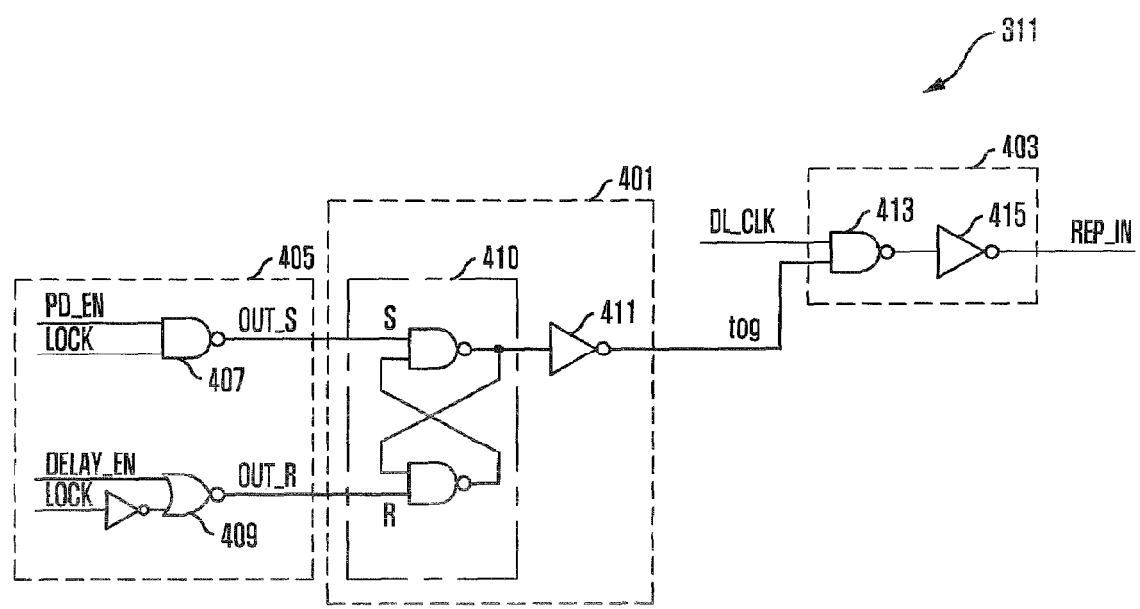
FIG. 4 is a circuit diagram of a toggling controller 311 of FIG. 3.

FIG. 4 is a circuit diagram of a toggling controller 311 of FIG. 3.

As shown in FIG. 4, the toggling controller 311 according to the present embodiment includes a toggling termination signal generator 401 for enabling and outputting a toggling termination signal TOG from an enable point of the phase comparison enable signal PD_EN and an enable point of a delay control enable signal DELAY_EN and an output unit 403 for receiving the delayed external clock DL_CLK and the enabled toggling termination signal TOG and disabling toggling of the delayed external clock DL_CLK to a predetermined logical level.

The toggling termination signal generator 401 includes a controller 405 for enabling the toggling termination signal generator only for the update process, a latch 410 for outputting a toggling termination signal TOG that is disabled by the phase comparison enable signal PD_EN and enabled by the delay control enable signal DELAY_EN; and an inverter 411 for inverting an output signal of the latch 410.

The controller 405 controls set and reset of the latch based on the phase comparison enable signal PD_EN and the delay control enable signal DELAY_EN in response to a locking signal LOCK, thereby enabling the toggling controller 311 only after locking the DLL circuit. The controller 405 will be described in detail in later.

The latch 410 outputs a low level signal if a high level signal is inputted to an input end S and a low level signal is inputted to an input end R, and outputs a high level signal if a high level signal is inputted to an input end R and a low level signal is inputted to an input end S. The latch 410 continuously sustains a previously output level if high level signals are inputted to both of the input ends S and R.

In the update process, a phase comparison enable signal PD_EN and a delay control enable signal DELAY_EN are regularly enabled to a high level with a longer interval than that in the locking process, and the phase comparison enable signal PD_EN and the delay control enable signal DELAY_EN are inversed and inputted to the latch 410. Since the delay control enable signal DELAY_EN is enabled after the phase comparison enable signal PD_EN is enabled, the latch 410 receives a low level signal at the input end S and a high level signal at an input end R and receives a high level signal at the input end S and a high level signal at the input end R. Then, the latch 410 receives a high level signal at the input end S and a low level signal at the input end R again. Finally, the output signal of the latch 410 sustains a high level after the phase comparison enable signal PD_EN is enabled and is changed to a low level signal after the delay control enable signal DELAY_EN is enabled.

The toggling termination signal from the inverter 411 is enabled to a low level after the phase comparison enable signal PD_EN is enabled. Then, the toggling termination signal is disabled to a high level signal again after the delay control enable signal DELAY_EN is enabled.

The output unit 403 includes a NAND gate 413 and an inverter 415. The NAND gate 413 receives a toggling termination signal TOG and a delayed external clock DL_CLK. Therefore, if the toggling termination signal TOG is enabled to a low level, the NAND gate 413 transforms the delayed external clock DL_CLK to a low level signal, thereby terminating the toggling. The output unit 403 passes the delayed external clock DL_CLK as it is if the toggling termination signal TOG is disabled to a high level.

In brief, a toggling termination signal enabled to a low level is generated from an enable point of a phase comparison enable signal PD_EN to an enable point of a delay control enable signal DELAY_EN. The output unit 403 receives the delayed external DL_CLK and the toggling termination signal TOG and outputs a low level output signal REP_IN by terminating toggling of the delayed external clock DL_CLK when the toggling termination signal TOG is enabled.

Meanwhile, a phase comparison enable signal PD_EN and a delay control enable signal DELAY_EN are also generated in the locking process. If the phase comparison enable signal PD_EN and the delay control enable signal DELAY_EN are inputted to the toggling termination signal generator 401, the toggling controller 311 disables toggling of the delayed external clock DL_CLK. Therefore, it is necessary to have the controller 405 that enables the toggling termination signal controller 401 only for the update process.

The controller 405 includes a NAND gate 407 for receiving the locking signal LOCK and the phase comparison enable signal PD_EN and a NOR gate 409 for receiving the inversed locking signal LOCK and the delay control enable signal.

Before locking, the locking signal LOCK is disabled to a low level. The phase comparison enable signal PD_EN and the delay control enable signal DELAY_EN are regularly enabled to a high level. Therefore, the output signal OUT_S of the NAND gate 407 is always a high level, and the output signal OUT_R of the NOR gate 409 is always a low level.

Therefore, the latch 410 always outputs a low level before the locking signal LOCK is enabled to a high level, and the toggling termination signal TOG is always enabled to a high level after passing through the inverter 411. That is, the controller 405 disables the toggling termination signal generator 401 before the locking signal LOCK is enabled.

After the update process, the locking signal LOCK is enabled to a high level. Therefore, after locking, the output signal OUT_S of the NAND gate 407 becomes a low level only when the phase comparison enable signal PD_EN is enabled to a high level, and the output signal OUT_R of the NOR gate 409 becomes a low level only when the delay control enable signal DELAY_EN is enabled to a high level.

Therefore, the low level signal is sequentially inputted to the latch 410 when the phase comparison enable signal PD_EN and the delay control enable signal DELAY_EN are enabled, thereby enabling the toggling termination signal generator 401.

The controller 405 may include a first pass gate and a second pass gate. The first pass gate is turned on by the locking signal LOCK for passing the phase comparison enable signal PD_EN. The second pass gate is turned on by the locking signal LOCK for passing the delay control enable signal DELAY_EN.

Figure 5:
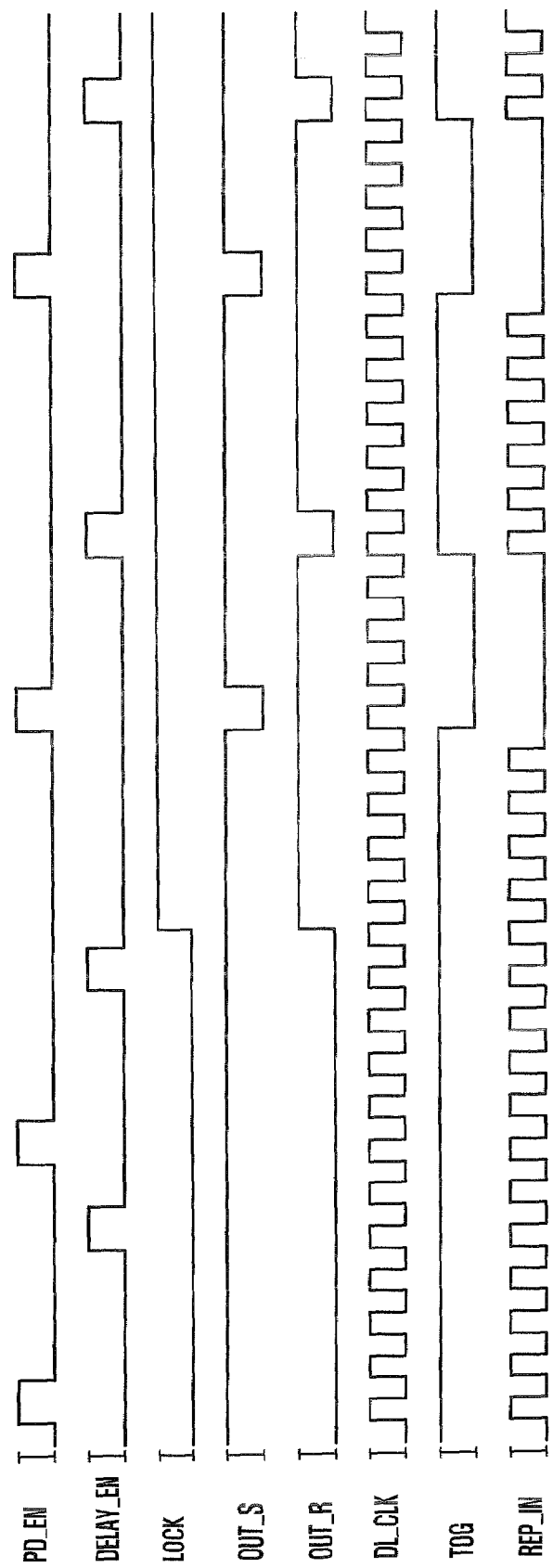
FIG. 5 is a timing diagram illustrating overall operation of the invention.

FIG. 5 is a timing diagram illustrating overall operation of the invention.

As shown, there is a difference between an interval of generating the phase comparison enable signal PD_EN and the delay control enable signal DELAY_EN before locking and an interval of generating the phase comparison enable signal PD_EN and the delay control enable signal DELAY_EN in the update process after locking.

Since the controller 405 disables the toggling termination signal generator 401 in the locking process, the output signal REP_IN of the toggling controller 311 is identical to the delayed external clock DL_CLK inputted to the toggling controller 211.

In the update process after locking, the NAND gate 407 of the controller 405 receives the locking signal LOCK enabled to the high level and the phase comparison enable signal PD_EN. Therefore, the output signal OUT_S of the NAND gate 407 becomes a low level when the phase comparison enable signal PD_EN is enabled to a high level.

The NOR gate 409 of the controller 405 receives the locking signal after reversing the locking signal and the delayed control enable signal DELAY_EN. Therefore, the output signal OUT_R of the NOR gate 409 becomes a low level when the delay control enable signal DELAY_EN is enabled to a high level.

The latch 410 of the toggling termination signal generator 401 receives the output signals OUT_S and OUT_R of the NAND gate 407 and the NOR gate 409. If the enable signal PD_EN is enabled to a high level, the output signal OUT_S of the NAND gate 307 becomes a low level. As shown in FIG. 4, if the input end S of the latch 410 receives a low level and the input end R of the latch 410 receives a high level, the output signal of the latch 310 becomes a high level and the toggling termination signal TOG is enabled to a low level through the inverter 411.

Then, the output signal OUT_S of the NAND gate 407 becomes a high level when the phase comparison enable signal PD_EN is disabled to a low level. Since the high level signals are inputted to the input ends S and R of the latch 410, the output signal of the latch 410 sustains a previous level, that is, a high level, and the toggling signal TOG sustains a low level through the inverter 411.

Then, the output signal OUT_R of the NOR gate 409 becomes a low level when the delay control enable signal DELAY_EN becomes a high level. When the input end S of the latch 410 receives a high level, the input end R receives a low level. Therefore, the output signal of the latch 410 becomes a low level again, and the toggling termination signal TOG is disabled to a high level through the inverter 411.

The phase comparison enable signal PD_EN is enabled to a high level again, and the same operation is repeated. The toggling termination signal TOG is enabled from a time of enabling the phase comparison enable signal PD_EN to a time of enabling the delay control enable signal DELAY_EN.

The output unit 403 receives the toggling termination signal TOG and the delayed external clock DL_CLK and outputs the output signal REP_IN to the replica unit 305. Only when the toggling termination signal TOG is enabled to a low level, toggling of the output signal REP_IN is disabled.

While the invention has been described with respect to the specific embodiments, it will be apparent to those skilled in the art that various changes and modifications may be made without departing from the spirit and scope of the invention as defined in the following claims.

What is claimed is:

1. A delay locked loop (DLL) circuit, comprising:
   a phase comparator configured to compare a phase of a feedback clock and a phase of an external clock;
   a delay unit configured to delay an external clock in response to a comparison signal from the phase comparison;
   a replica unit configured to receive the delayed external clock and output the feedback clock; and
   a toggling controller configured to disable toggling of the delayed external clock that is inputted to the replica unit for a predetermined time at a regular interval after locking.

2. The DLL circuit of claim 1, wherein the predetermined time is from when the phase comparator performs a phase comparison operation to when the delay unit performs a delay control operation.

3. The DLL circuit of claim 1, wherein the phase comparator and the delay unit are configured to operate in response to a phase comparison enable signal and a delay control enable signal that are sequentially generated, and
   the toggling controller includes:
   a toggling termination signal generator configured to enable a toggling termination signal from a point of enabling the phase comparison enable signal to a point of enabling the delay control enable signal and to output the enabled toggling termination signal; and
   an output unit configured to receive the delayed external clock and the toggling termination signal and to disable toggling of the delayed external clock to a predetermined logical level.

4. The DLL circuit of claim 3, wherein the toggling termination signal generator includes:
   a controller configured to enable the toggling termination signal generator after locking;
   a latch configured to output a toggling termination signal that is disabled by the phase comparison enable signal and enabled by the delay control enable signal; and
   an inverter configured to invert an output signal of the latch.

5. The DLL circuit of claim 3, further comprising a mode generator configured to output an enabled locking signal in response to the comparison signal after locking.

6. The DLL circuit of claim 4, wherein the controller is configured to control the latch based on the phase comparison enable signal and the delay control enable signal in response to the locking signal.

7. A delay locked loop (DLL) circuit, comprising:
a phase comparator configured to compare a phase of a feedback clock and a phase of an external clock;
a delay controller configured to output a delay control signal in response to a comparison signal of the phase comparator for controlling a delay value of the external clock;
a delay line unit configured to delay the external clock in response to the delay control signal and to output the external clock;
a replica unit configured to receive the delayed external clock and to output the feedback clock;
a mode generator configured to output a locking signal that informs whether the DLL circuit is locked or not;
a pulse generator configured to control operations of the phase comparator, the mode generator, and the delay controller; and
a toggling controller configured to disable toggling of the delayed external clock inputted to the replica unit from when the phase comparator operates to when the delay controller operates after the locking signal is enabled.

8. The DLL circuit of claim 7, wherein the pulse generator is configured to sequentially generate a phase comparison enable signal to enable the phase comparator and a delay control enable signal to enable the delay controller.

9. The DLL circuit of claim 7, wherein the toggling controller includes:
a toggling termination signal generator configured to enable a toggling termination signal from a point of enabling the phase comparison enable signal to a point of enabling the delay control enable signal; and
an output unit configured to receive the delayed external clock and the enabled toggling termination signal and disable toggling of the delayed external clock to a predetermined logical level.

10. A method for delay locked loop (DLL), comprising:
comparing a phase of a feedback clock and a phase of an external clock;
delaying an external clock in response to a comparison signal from the phase comparison;
receiving the delayed external clock and outputting the feedback clock; and
disabling a toggling of the delayed external clock for a predetermined time at a regular interval after locking.

11. The method of claim 10, wherein the predetermined time is from performing a phase comparison operation to performing a delay control operation.

12. The method of claim 10, further comprising:
enabling a toggling termination signal from a point of enabling the phase comparison enable signal to a point of enabling the delay control enable signal and outputting the enabled toggling termination signal; and
receiving the delayed external clock and the toggling termination signal and disabling toggling of the delayed external clock to a predetermined logical level.

13. The method of claim 12, wherein the enabling the toggling termination signal includes:
enabling the toggling termination signal generator after locking;
outputting the toggling termination signal that is disabled by the phase comparison enable signal and enabled by the delay control enable signal; and
inverting the toggling termination signal.

14. The method of claim 12, further comprising:
outputting an enabled locking signal in response to the comparison signal after locking.

15. The method of claim 14, wherein the toggling termination signal is controlled based on the phase comparison enable signal and the delay control enable signal in response to the locking signal.

* * * * *